(12) United States Patent
Chu et al.

(10) Patent No.: US 9,466,681 B2
(45) Date of Patent: Oct. 11, 2016

(54) METHOD AND APPARATUS FOR FORMING A SEMICONDUCTOR GATE

(71) Applicant: TAIWAN SEMICONDUCTOR MANUFACTURING COMPANY, LTD., Hsin-Chu (TW)

(72) Inventors: Chen-Liang Chu, Hsin-Chu (TW);
Fei-Yun Chen, Hsinchu (TW);
Chih-Wen Albert Yao, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/737,802

(22) Filed: Jun. 12, 2015

(65) Prior Publication Data

US 2015/0279951 A1 Oct. 1, 2015

Related U.S. Application Data

(63) Continuation of application No. 13/968,507, filed on Aug. 16, 2013, now Pat. No. 9,070,663, which is a continuation of application No. 12/568,575, filed on Sep. 28, 2009, now Pat. No. 8,513,712.

(51) Int. Cl.
| | |
|---|---|
| *H01L 29/423* | (2006.01) |
| *H01L 29/78* | (2006.01) |
| *H01L 29/06* | (2006.01) |
| *H01L 29/66* | (2006.01) |
| *H01L 29/40* | (2006.01) |

(52) U.S. Cl.
CPC ....... *H01L 29/4238* (2013.01); *H01L 29/0619* (2013.01); *H01L 29/0653* (2013.01); *H01L 29/401* (2013.01); *H01L 29/42316* (2013.01); *H01L 29/42376* (2013.01); *H01L 29/66477* (2013.01); *H01L 29/66659* (2013.01); *H01L 29/78* (2013.01); *H01L 29/7835* (2013.01)

(58) Field of Classification Search
CPC .......... H01L 29/4238; H01L 29/0653; H01L 29/52376; H01L 29/66659; H01L 29/7835; H01L 29/0619; H01L 29/401; H01L 29/66447; H01L 29/78; H01L 21/823857; H01L 29/1033; H01L 29/42316; H01L 29/4234

See application file for complete search history.

(56) References Cited

U.S. PATENT DOCUMENTS

| | | | |
|---|---|---|---|
| 3,906,255 A | * | 9/1975 | Mensch, Jr. ............ H01L 21/00 257/506 |
| 5,714,413 A | | 2/1998 | Brigham et al. |
| 5,734,185 A | | 3/1998 | Iguchi et al. |
| 5,852,576 A | | 12/1998 | Le et al. |
| 5,929,480 A | | 7/1999 | Hisamune |
| 6,034,393 A | | 3/2000 | Sakamoto et al. |
| 6,222,788 B1 | | 4/2001 | Forbes et al. |

(Continued)

*Primary Examiner* — Galina Yushina
(74) *Attorney, Agent, or Firm* — Haynes and Boone, LLP

(57) ABSTRACT

The present disclosure provides an apparatus and method for fabricating a semiconductor gate. The apparatus includes, a substrate having an active region and a dielectric region that forms an interface with the active region; a gate electrode located above a portion of the active region and a portion of the dielectric region; and a dielectric material disposed within the gate electrode, the dielectric material being disposed near the interface between the active region and the dielectric region. The method includes, providing a substrate having an active region and a dielectric region that forms an interface with the active region; forming a gate electrode over the substrate, the gate electrode having an opening near a region of the gate electrode that is above the interface; and filling the opening with a dielectric material.

20 Claims, 7 Drawing Sheets

(56) References Cited

U.S. PATENT DOCUMENTS

| | | |
|---|---|---|
| 6,720,627 B1 | 4/2004 | Iwata et al. |
| 6,838,726 B1 | 1/2005 | Forbes et al. |
| 7,372,083 B2 | 5/2008 | Lee et al. |
| 7,388,266 B2 | 6/2008 | Wu |
| 7,521,759 B2 | 4/2009 | Sasaki |
| 7,863,192 B2 | 1/2011 | Frank et al. |
| 2004/0206983 A1* | 10/2004 | Yi ................ H01L 23/4824 257/202 |
| 2006/0214223 A1* | 9/2006 | Sasaki ............. H01L 29/0847 257/336 |
| 2006/0234453 A1* | 10/2006 | Lee ................ H01L 21/28282 438/264 |
| 2006/0255430 A1* | 11/2006 | Wu ................. H01L 23/5225 257/605 |
| 2007/0072352 A1 | 3/2007 | Kushiyama et al. |
| 2007/0210385 A1 | 9/2007 | Ker et al. |
| 2008/0206975 A1* | 8/2008 | Sakai ............. H01L 21/823842 438/591 |

\* cited by examiner

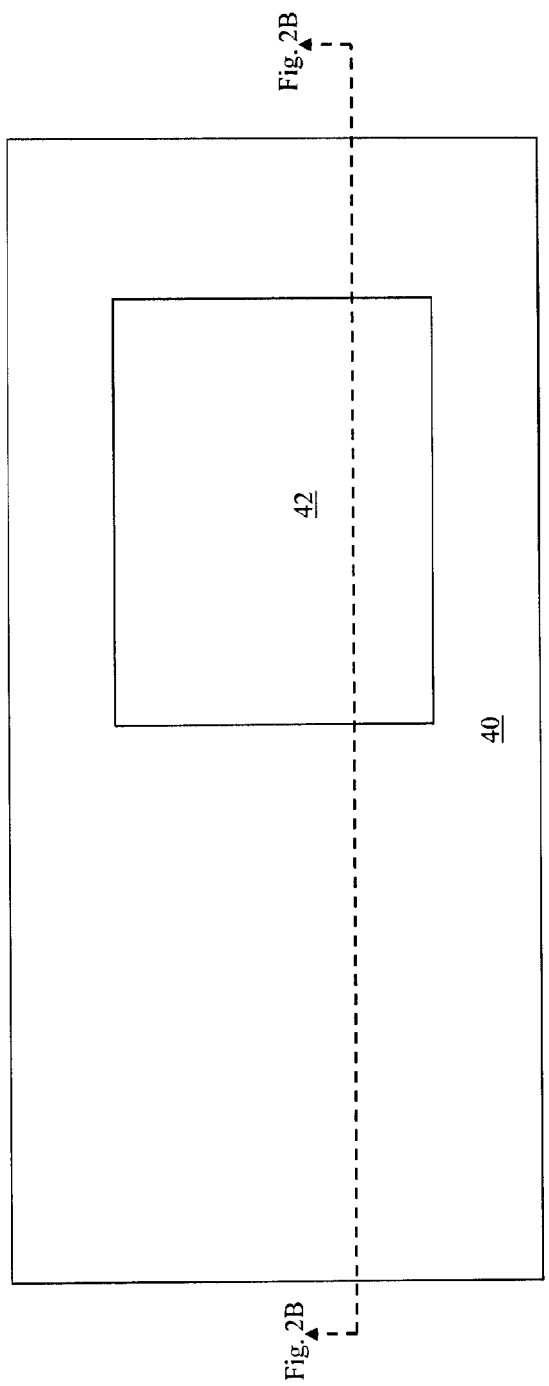
Fig. 2A (TOP VIEW)
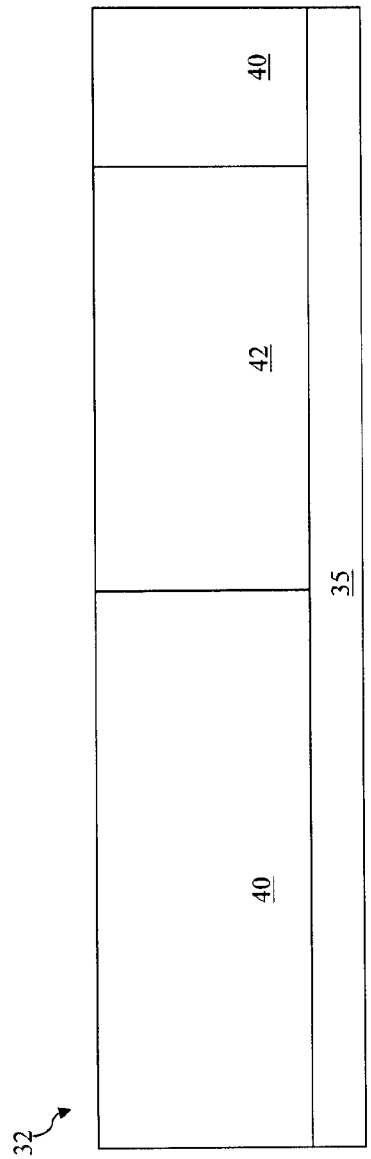
Fig. 2B (CROSS SECTIONAL VIEW)

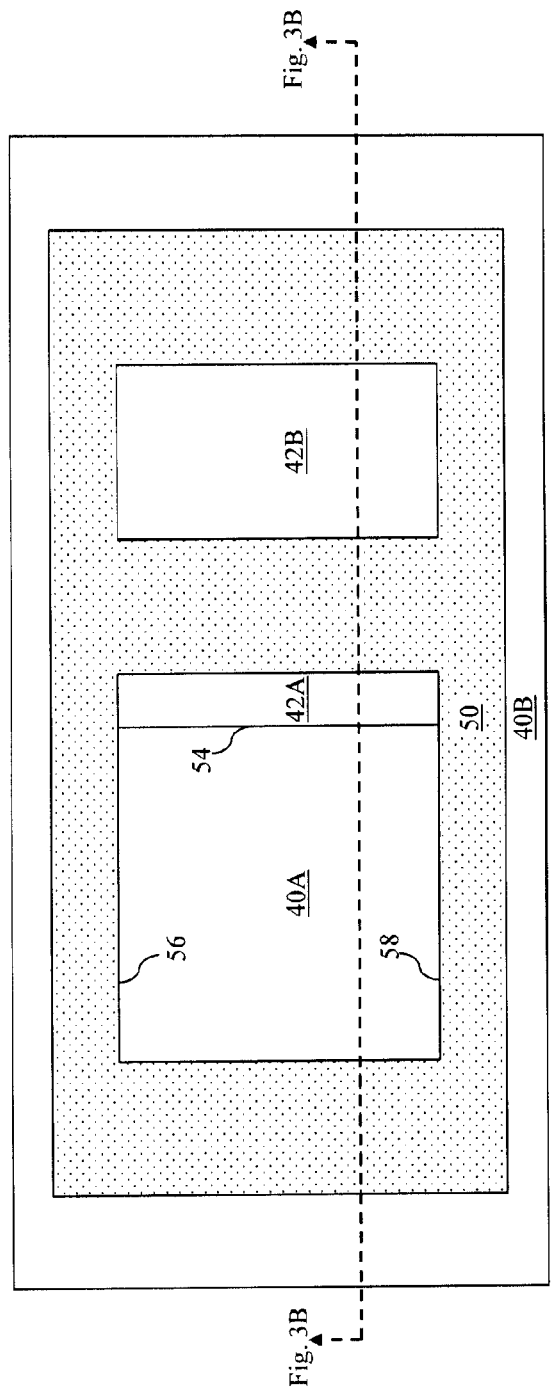
Fig. 3A (TOP VIEW)
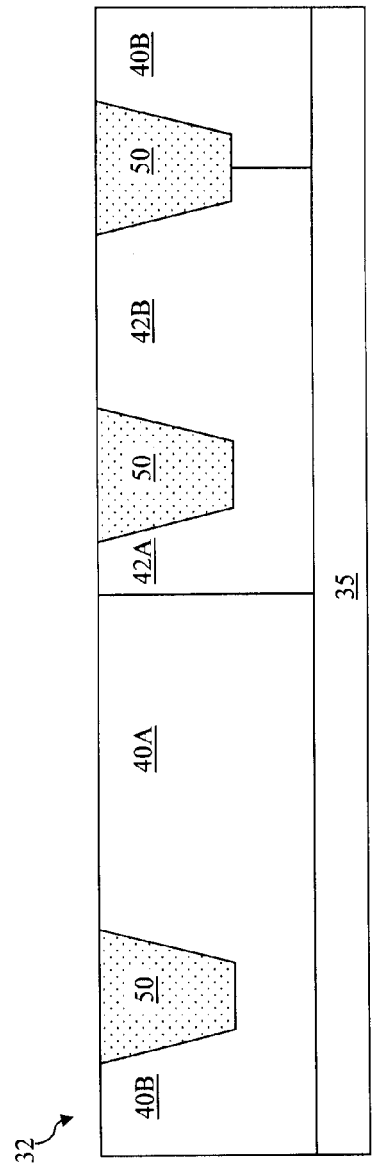
Fig. 3B (CROSS SECTIONAL VIEW)

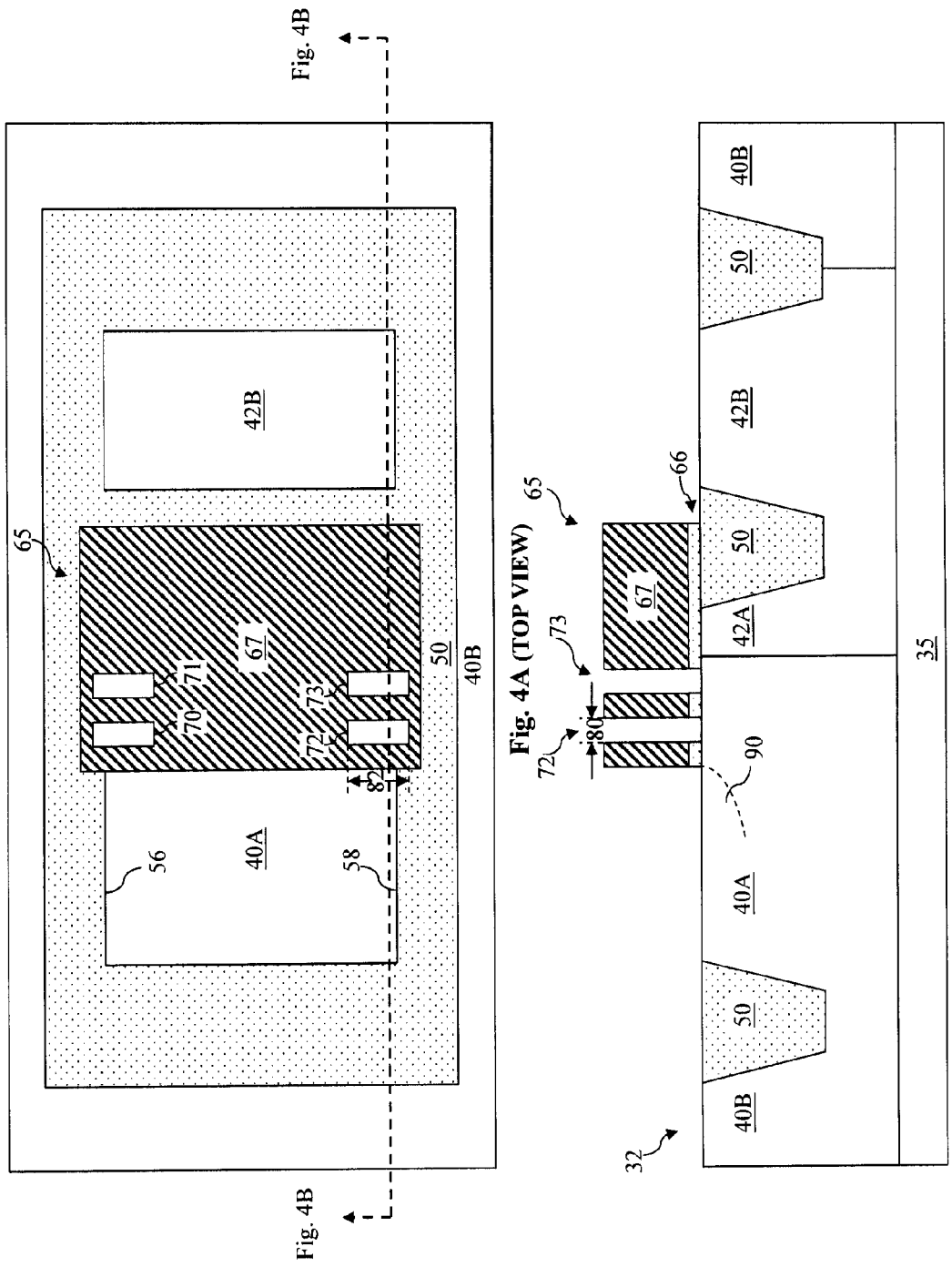

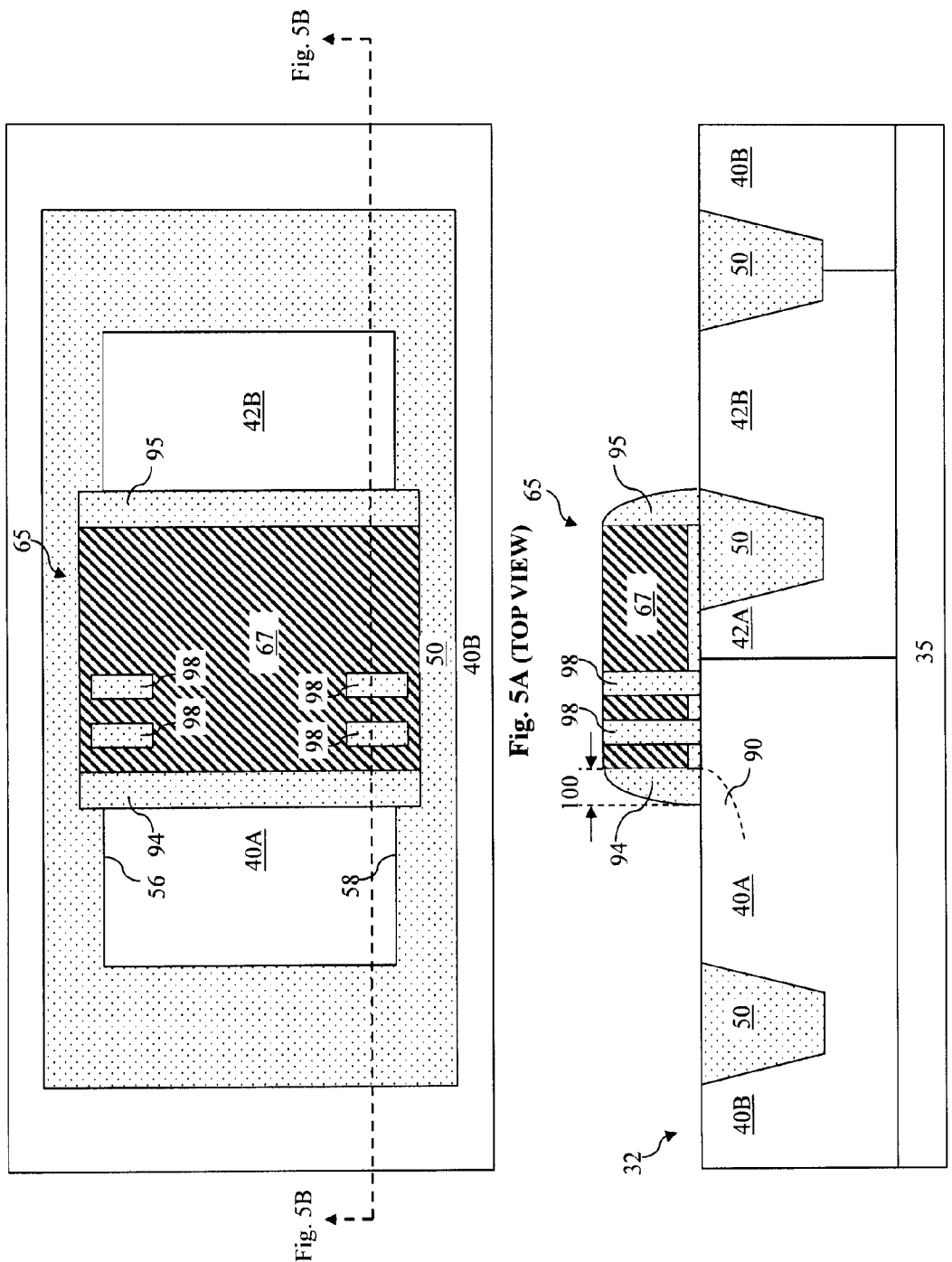
Fig. 5A (TOP VIEW)
Fig. 5B (CROSS SECTIONAL VIEW)

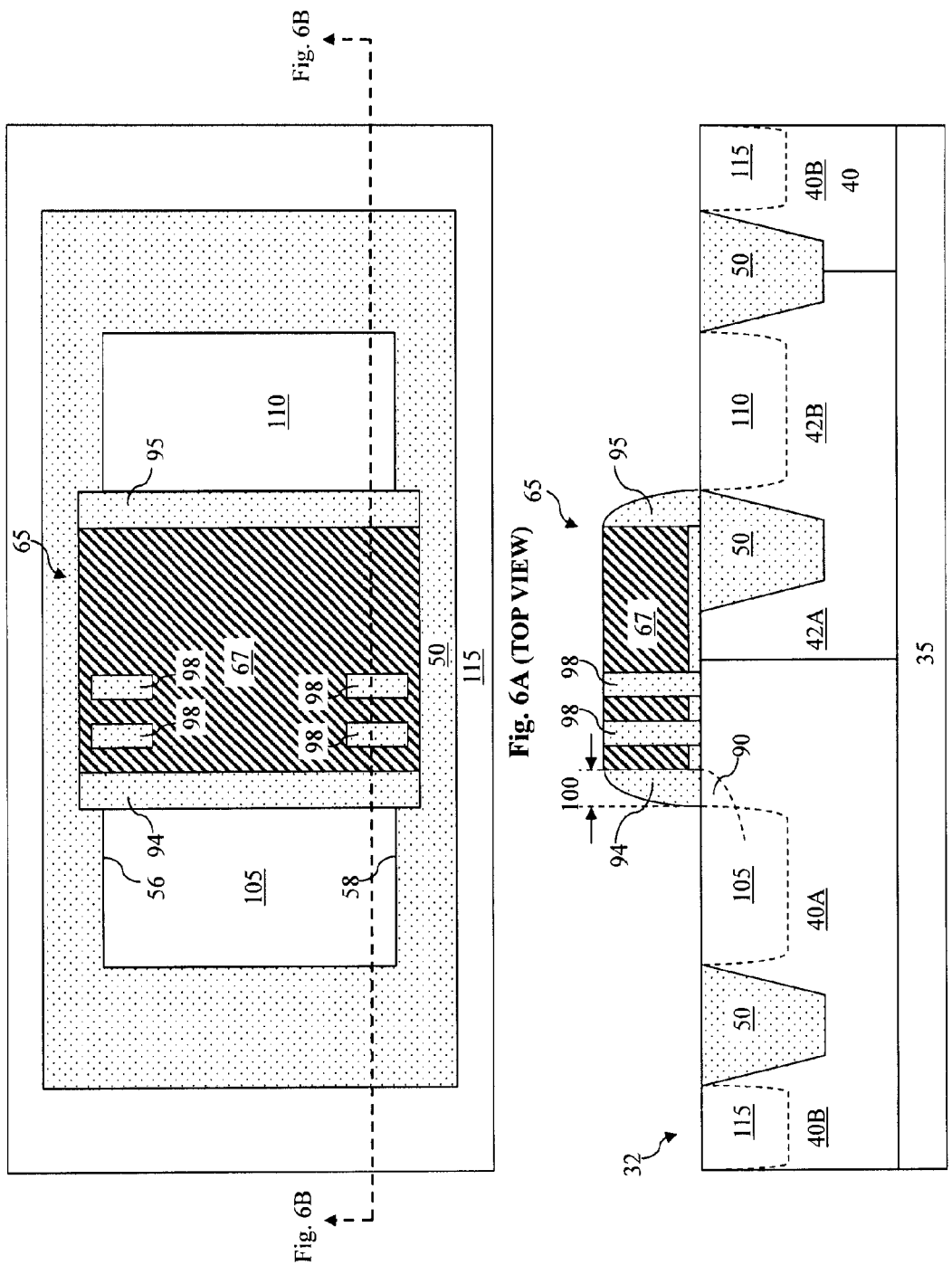

US 9,466,681 B2

METHOD AND APPARATUS FOR FORMING A SEMICONDUCTOR GATE

PRIORITY DATA

This application is a continuation application of U.S. patent Ser. No. 13/968,507, filed on Aug. 16, 2013, now U.S. Pat. No. 9,070,663, issued Jun. 30, 2015, which is a continuation application of U.S. patent application Ser. No. 12/568,575, filed on Sep. 28, 2009, now U.S. Pat. No. 8,513,712, issued Aug. 20, 2013, the disclosures of each are hereby incorporated by reference in their entirety.

FIELD OF THE INVENTION

The present disclosure relates generally to a semiconductor device, and more particularly, to a method of fabricating a gate electrode of a semiconductor device.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As geometry size continues to be scaled down, a desired current-voltage relationship of a transistor may be more difficult to achieve, for example for a high voltage transistor. In particular, the existing methods of forming a gate electrode of the high voltage transistor may lead to undesired behaviors in the current-voltage relationship, which may potentially interfere with the transistor's operation.

Therefore, while existing methods of fabricating gate electrodes of semiconductor integrated circuit devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 6A illustrate top level views of the semiconductor device at various stages of fabrication according to the method of FIG. 1;

FIGS. 2B to 6B illustrate cross-sectional side views of the semiconductor device at various stages of fabrication according to the method of FIG. 1.

SUMMARY

Figure 1:
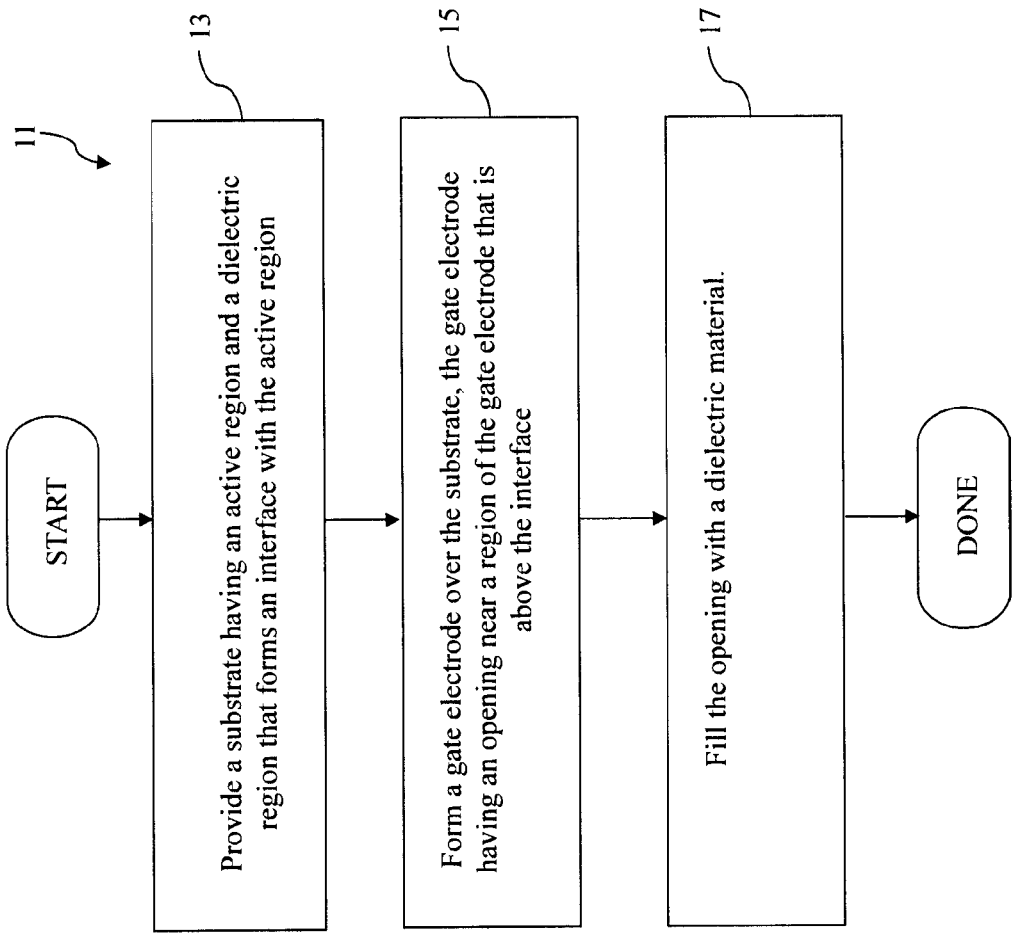
FIG. 1 is a flowchart illustrating a method of fabricating a semiconductor device according to various aspects of the present disclosure.

One of the broader forms of an embodiment the present disclosure involves a semiconductor device. The semiconductor device includes a substrate; a gate electrode located over the substrate, the gate electrode having an upper surface; and a dielectric material disposed within the gate electrode, the dielectric material extending from the upper surface toward the substrate.

Another of the broader forms of an embodiment of the present disclosure involves a semiconductor device. The semiconductor device includes a gate having first, second, third, and fourth edges that together define the gate, the first and second edges being disposed on opposite sides, the third and fourth edges being disposed on opposite sides; first and second spacers formed adjacent to the first and second edges of the gate, respectively; and a dielectric structure disposed within the gate, the dielectric structure being located near the third edge.

Still another of the broader forms of an embodiment of the present disclosure involves a semiconductor device. The semiconductor device includes a layer having an active region and a dielectric region that forms an interface with the active region; a gate electrode located above a portion of the active region and a portion of the dielectric region; and a dielectric material disposed within the gate electrode, the dielectric material being disposed near the interface between the active region and the dielectric region.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 11 for fabricating a semiconductor transistor device. FIGS. 2A-6A are diagrammatic fragmentary top level views of the semiconductor transistor device during various fabrication stages. FIGS. 2B-6B are diagrammatic fragmentary cross-sectional side views of the semiconductor transistor device during various fabrication stages. The semiconductor transistor device may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-6 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIG. 1, the method 11 begins with block 13 in which a substrate is provided. The substrate has an active region and a dielectric region that forms an interface with the active region. The method 11 continues with block 15 in which a gate electrode is formed over the substrate. The gate electrode has an opening near a region of the gate electrode that is above the interface. The method 11 continues with block 17 in which the opening is filled with a dielectric material.

Referring now to FIGS. 2A-B, a semiconductor transistor device 32 includes a substrate 35. The substrate 35 is a semiconductor substrate in the present embodiment. For example, the substrate 35 may be a silicon substrate. The substrate 35 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

A p-type well 40 and a n-type well 42 is formed in the substrate 35. In the present embodiment, the wells 40 and 42 are high voltage wells and are thereafter referred to as HVPW and HVNW, respectively. The HVNW 42 is surrounded by the HVPW 40 in the present embodiment. It is understood that the HVNW 42 and the HVPW 40 may have other suitable configurations in alternative embodiments. It is also understood that the dashed lines and arrows of FIG. 2A denote the location of the semiconductor transistor device 32 at which the cross sectional side view of FIG. 2B is taken.

Referring now to FIGS. 3A-B, a shallow trench isolation (STI) 50 is formed in the HVPW 40 and the HVNW 42. The STI 50 is formed by etching openings in the HVPW 40 and the HVNW 42, and then filling the openings with a dielectric material using a deposition process known in the art, such as chemical vapor deposition (CVD), physical vapor deposition (PVD), atomic layer deposition (ALD), or combinations thereof. The dielectric material is silicon oxide in the present embodiment, but may be silicon nitride or silicon oxynitride in other embodiments.

Referring back to FIG. 3A, the STI 50 separates the HVPW 40 into two regions, HVPW 40A and HVPW 40B. The STI 50 also separates the HVNW 42 into two regions, HVNW 42A and HVNW 42B. The HVPW 40B has an approximately rectangular ring shape and encircles the STI 50 and the HVPW 40A and the HVNW 42A-B. The HVPW 40A and HVNW 42A-B each has an approximately rectangular shape in the present embodiment, but may have other shapes in alternative embodiments, for example, a circular shape. Referring back to FIGS. 3A-B, an interface 54 is formed by the HVPW 40A and the HVNW 42A, an interface 56 is formed by one edge of the HVPW 40A and the STI 50, and an interface 58 is formed by another edge of the HVPW 40A and the STI 50. In the present embodiment, these two edges are on opposing sides of the HVPW 40A.

Referring now to FIGS. 4A-B, a gate 65 is formed over the HVNW 42A and a portion of the HVPW 40A and a portion of the STI 50. The gate 65 includes a gate dielectric 66 that is formed over the HVPW 40A and the HVNW 42A. The gate dielectric 66 includes a high-k material in the present embodiment. In alternative embodiments, the gate dielectric 66 may include silicon oxide, silicon nitride, silicon oxynitride, or combinations thereof. Referring back to FIGS. 40A-B, the gate 65 also includes a gate electrode 67 that is located over the gate dielectric 66. The gate electrode 67 includes a polysilicon material in the present embodiment. In alternative embodiments, the gate electrode may include metal.

Referring back to FIGS. 4A-B, the gate 65 includes a plurality of openings, for example openings 70, 71, 72, and 73 in the present embodiment. The openings 70-73 are formed by designing a photomask (not illustrated but is used to pattern the gate 65) in a manner such that the photomask has openings corresponding to the openings 70-73. Therefore, the openings 70-73 are formed along with the rest of the gate 65, which includes deposition processes for the gate dielectric 66 and the gate electrode 67 and a patterning process to pattern the gate 65. In alternative embodiments, the openings 70-73 may be formed by forming a gate 65 having no openings and thereafter etching the openings 70-73 in the gate 65, for example through a dry etching process.

Referring back to FIGS. 4A-B, the openings 70-73 each have an approximately rectangular shape. The openings 70 and 71 are located near the interface 56, and the openings 72 and 73 are located near the interface 58. In the present embodiment, the openings 70 and 71 are located directly above the interface 56, and the openings 72 and 73 are located directly above the interface 58. The openings 70-73 have substantially similar shapes and sizes and each have a short edge and a long edge and respective dimensions 80 and 82 measured along the short and long edges. The dimension 80 may also be referred to as a width, and the dimension 82 may also be referred to as a length. In the present embodiment, the dimension 82 is greater than about 0.2 microns (um). In other embodiments, the openings 70-73 may have different shapes and sizes depending on design requirements and manufacturing concerns. For example, the openings 70 and 71 may have bigger (or smaller) respective dimensions than the openings 72 and 73, or that the openings 70-73 may not have approximately rectangular shapes. Further, it is understood that more (or less) than two openings may be formed near each of the interfaces 56 and 58.

Referring back to FIG. 4B, a lightly doped source (LDD) region 90 is formed in the HVPW 40A. The LDD region 90 is formed by using a photomask (not illustrated) to form a photoresist mask (not illustrated) as a protection layer for an LDD ion implantation process. The photoresist mask also fills the openings 70-73. The LDD ion implantation process is then performed on the HVPW 40A to form the LDD region 90. Thereafter, the photoresist mask is removed using a suitable technique known in the art, for example through a photoresist stripping process. After the removal of the photoresist mask, the openings 70-73 are empty again and ready to be filled with another material. One purpose served by the photoresist mask is that the ions of the LDD ion implantation process would not penetrate the regions of the HVPW 40A beneath the openings 70-73, because the openings 70-73 are protected by the photoresist mask during implantation.

Referring now to FIGS. 5A-B, a dielectric layer 98 is deposited over the gate 65 and then anisotropically etched to form gate electrode spacers 94 and 95 on either side of the gate 65, respectively. The deposition of the dielectric layer 98 also fills the openings 70-73 with the dielectric layer. The dielectric layer 98 includes a dielectric material such as silicon nitride, silicon oxynitride, silicon oxide, or combinations thereof. The spacers 94 and 95 each have a dimension 100 that is measured in the same direction as the dimension 80 of the openings 70-73. The dimension 100 is also referred to as a width of the spacers 94 and 95. In the present embodiment, the dimension 80 of the openings 70-73 is smaller than approximately two times the dimension 100. Alternatively stated, the dimension 100 is greater than about ½ of the dimension 80. Such design configuration is chosen for the dimensions 80 and 100 because if the dimension 80 of the openings 70-73 is greater than about two times the dimension 100, the dielectric layer 98 filling the openings 70-73 would be affected by the etching (used to form the spacers 94 and 95) in such a way that the middle portion of the dielectric layer 98 in each of the openings would be "caved-in" and having slopes that are similar to the profiles of the spacers 94 and 95, which would be undesirable. The relationship between the dimensions 80 and 100 in the present embodiment ensures that such "caved-in" or sloped dielectric layer 98 will not occur in the openings 70-73. Alternatively stated, the dielectric layer 98 within the openings 70-73 will fully fill the openings after undergoing the anisotropic etching process.

Referring now to FIGS. 6A-6B, a source region 105 and a drain region 110 are formed in the HVPW 40A and the HVNW 42B, respectively. The source region 105 and the drain region 110 are formed by an ion implantation process that implants n-type ions (such as phosphorous or arsenic) into the HVPW 40A and the HVNW 42B. The concentration of the source region 105 and the drain region 110 may be determined by a dosage of the ions of the ion implantation process. The depth of the source region 105 and the drain region 110 (how deep they respectively penetrate into the HVPW 40A and the HVNW 42B) may be determined by an implantation energy of the ion implantation process. Depending on design requirements and manufacturing concerns, the ion implantation process may be tuned to control the depth and concentration of the source region 105 and the drain region 110. The STI 50 and the spacers 94 and 95 essentially align the source region 105 and the drain region 110 to be respectively formed between the STI 50 and the spacer 94, and between the STI 50 and the spacer 95.

A guard ring 115 in also formed in the present embodiment. The guard ring is formed by doping the HVPW 40B with p-type ions (such as boron) through another ion implantation process. As can be seen from FIG. 6A, the guard ring 115 encircles the STI 50, the source region 105, the drain region 110, the spacers 94-95, and the gate 65. The guard ring 115 allows an electrical bias to be applied to the HVPW 40 through the guard ring, in which case the guard ring 115 serves as a contact or interface area. It is understood that the formation of the guard ring 115 is optional, and it may be formed before or after the formation of the source region 105 and the drain region 110.

It is understood that further CMOS fabrication processes may be performed on the semiconductor device 32 to complete its fabrication. For example, a contact etch stop layer (CESL) may be formed over the substrate 35. The contact etch stop layer (CESL) may be formed of silicon nitride, silicon oxynitride, and/or other suitable materials. The CESL composition may be selected based upon etching selectivity to one or more additional features of the semiconductor device 32. Further, the CESL may be configured as a tensile-CESL or a compressive-CESL depending on the transistor type. For the sake of simplicity, these additional fabrication processes are not discussed or illustrated.

Figure 7A:
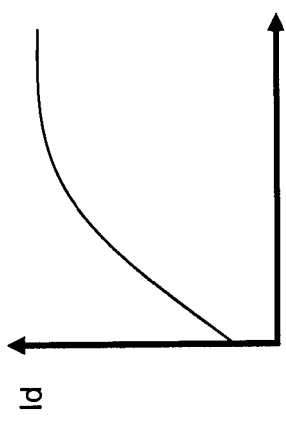
FIGS. 7A and 7B are exemplary current-voltage curves of semiconductor devices.

During the actual operation of the semiconductor device 32, a channel (not illustrated) is formed between the source region 105 and the drain region 110. The electrical current in the channel is referred to as channel current, or $I_d$. The channel current $I_d$ is a function of a gate voltage applied at the gate 65, which is referred to as $V_g$. Referring now to FIG. 7A, an ideal or desired relationship (I/V curve) between the channel current $I_d$ and the gate voltage $V_g$ is illustrated. The horizontal axis represents the gate voltage, and the vertical axis represents the channel current. As can be seen from FIG. 7A, the desired I/V curve is relatively smooth. The channel current $I_d$ rises as the gate voltage $V_g$ increases, and eventually the channel current $I_d$ reaches a saturation level and remains at the saturation level even as the gate voltage $V_g$ becomes greater.

Figure 7B:
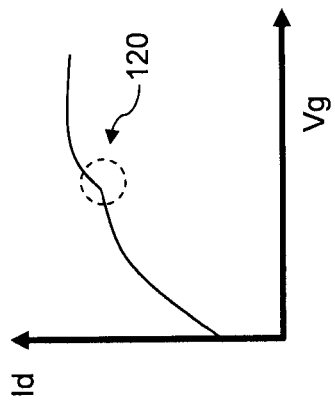

However, the ideal I/V curve illustrated in FIG. 7A is not achieved by existing high voltage transistors. The gate of existing high voltage transistors does not have openings 70-73 (FIGS. 4-6) within that are filled with a dielectric material. As gate voltage $V_g$ is applied to the gate of the existing high voltage transistors, the electric fields near interfaces that are similar to the interfaces 56 and 58 become highly concentrated and are stronger than the electric field in regions of the gate that are further away from the interfaces. Such high concentration of the electric field causes regions of the existing semiconductor device to be turned on more easily near the interfaces similar to the interfaces 56 and 58. This results in a "double hump" 120 in the I/V curve (to be discussed in more detail below), as illustrated in FIG. 7B. This double hump effect may lead to unpredictability and instability of the operation of the existing semiconductor device and is therefore undesired.

The implementation of the semiconductor device 32 in accordance with the present embodiment alleviates the double hump effect problem. Referring back to FIGS. 6A-B, the semiconductor device 32 can be viewed as the congregation of a plurality of small transistors (not individually illustrated) that are formed by conceptually "slicing" the semiconductor device 32 horizontally (in the same direction where the dimensions 80 and 100 are measured). For purposes of illustration and clarity, assuming for the sake of discussion that a gate similar to the gate 65 had not been implemented to have the dielectric layer 98 filling the openings 70-73. In that case, the conceptually sliced transistors that are located farther away from the interfaces 56 and 58 (in other words, closer to a middle region of the gate 65) have respective electric fields that are not so highly concentrated. These conceptually sliced transistors are thereafter referred to as non-edge region transistors. When the gate voltage $V_g$ reaches a threshold level $V_1$, the carriers in the channel region below that gate are "flipped" for these non-edge region transistors, which allows carriers to flow between the source region and the drain region of these non-edge region transistors. At this point, it can be said that the non-edge region transistors are turned on. If an I/V curve is to be plotted for each of the non-edge region transistors, the I/V curves would appear relatively smooth and be devoid of "double humps", such as the double hump 120 (FIG. 7B).

However, for the sliced transistors that are near the interfaces 56 and 58, the high concentration of electric field causes the carriers in the channel region below the gate to "flip" when the gate voltage $V_g$ reaches a voltage level $V_2$ that is smaller than $V_1$. These conceptually sliced transistors are thereafter referred to as edge region transistors. The edge region transistors begin conducting electrical current in the channel at a voltage level $V_2$ that is smaller than the desired threshold voltage level $V_1$. Alternatively stated, the edge region transistors "turn on too soon." This means that, the edge region transistors require a smaller gate voltage to induce the same level of channel current compared to the non-edge region transistors.

The overall channel current $I_d$ of the semiconductor device is a sum of all the channel currents of the conceptually sliced transistors, including the non-edge region transistors and the edge region transistors. The uneven distribution between the channel currents of the edge region transistors and the non-edge transistors is what causes the "double hump" 120 in the I/V curve (FIG. 7B) for existing high voltage transistors. For the sake of clarity, it is emphasized again that the discussions relating to the double hump effect above are all done with reference to a situation where the semiconductor device had not been formed in accordance with the present embodiment.

In the present embodiment, the dielectric layer 98 filling the openings 70-73 are not responsive to the gate voltage $V_g$ and thus make it harder for the carriers therebelow to "flip." Hence, although the edge region transistors operate under highly concentrated electric fields, their respective channel currents are not as strong as they would have been, compared to existing high voltage transistor devices where the dielectric layer 98 filling the openings 70-73 do not exist. Alternatively stated, the dielectric layer 98 in the gate 65 delays the edge region transistors from turning on. Looking at it from a different perspective, the gate voltage $V_2$ that is required to turn on the edge region transistors is now greater than it would have been and closer to $V_1$, the gate voltage required to turn on the non-edge region transistors. Therefore, the I/V curve of the semiconductor device 32 of the present embodiment is more smooth and approaches the appearance of the desired I/V curve of FIG. 7A, thus alleviating the double hump effect.

It is understood that certain simplifications have been used in the above discussions regarding alleviating the double hump effect in the present embodiment. For example, in real world transistor devices, the electric field distribution across different regions of the semiconductor device 32 may not follow a scenario where the electric fields are uniformly strong for each of the edge region transistors, or that the electric fields are uniformly moderate for each of the non-edge region transistors. In other words, the electric field may not have a step-wise behavior as it goes from a non-edge region transistor to an edge region transistor. In fact, the electric field itself may be similar to a curve, where it grows increasingly stronger as it gets closer to the edge region transistors, and may even experience an exponential uptick in strength as it approaches the interfaces 56 and 58. In addition, imperfections in geometries of the various components of the semiconductor device 32 and/or impurities therein may also affect the behavior of the electric field, which in turn affects the I/V curve of the semiconductor device 32.

However, the sizes, geometries, and the number of openings (filled with the dielectric layer 98) formed within the gate 65 can be designed to accommodate and address the complications discussed above in association to real world high voltage transistor devices. Specifically, the voltage $V_2$ that induces a channel current for its respective edge region transistor is a function of the number of openings 70-73 as well as the dimensions 80 and 82 of the openings 70-73 and the geometries of the openings 70-73. In addition, $V_2$ may be a function of the specific type of dielectric material used to form the dielectric layer 98. Therefore, the number of openings 70-73, the specific geometries of the openings, and the dimensions 80 and 82 of the openings are designed and implemented in a manner so that the I/V curve behavior for the edge region transistors and the non-edge region transistors are similar to one another. As an example, in one embodiment, the dimensions 80 and 82 of the openings are designed and implemented in a manner so that the gate voltage $V_2$ is approximately equal to the gate voltage $V_1$.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further embodiments may also include, but are not limited to, vertical diffused metal-oxide-semiconductor (VDMOS), other types of high power MOS transistors, Fin structure field effect transistors (FinFET), and strained MOS structures.

What is claimed is:

1. A semiconductor device, comprising:
   a substrate;
   a gate disposed over the substrate, wherein the gate includes at least one opening that extends from a top surface of the gate to a top surface of the substrate, wherein the at least one opening is completely filled with a dielectric material; and
   a source region, a channel region, and a drain region disposed in the substrate, wherein the channel region is disposed between the source region and the drain region, and wherein the channel region is disposed directly below the at least one opening.

2. The semiconductor device of claim 1, wherein the at least one opening includes a first opening and a second opening, and wherein the first opening and the second opening are each filled with the dielectric material.

3. The semiconductor device of claim 2, wherein:
   the first opening is disposed near a first edge of the gate; and
   the second opening is disposed near a second edge of the gate opposite the first edge.

4. The semiconductor device of claim 1, wherein:
   the substrate contains a well and an insulating material, the well and the insulating material forming an interface; and
   the at least one opening is disposed over the interface.

5. The semiconductor device of claim 4, wherein the insulating material encircles the well in a top view.

6. The semiconductor device of claim 5, wherein the substrate further contains a doped guard ring that encircles the insulating material in the top view.

7. The semiconductor device of claim 1, wherein the at least one opening has an elongate shape in a top view.

8. The semiconductor device of claim 1, wherein the at least one opening is disposed closer to the source than to the drain.

9. The semiconductor device of claim 1, further comprising a shallow trench isolation (STI) disposed at least partially below the gate and between the source and the drain.

10. A semiconductor device, comprising:
    a substrate;
    a gate disposed over the substrate;

a plurality of dielectric components embedded in the gate and extending from a top surface of the gate to a top surface of the substrate; and a source region, a channel region, and a drain region disposed in the substrate, wherein the channel region is disposed between the source region and the drain region, and wherein the plurality of dielectric components are each disposed over the channel region but not over the source region or the drain region.

11. The semiconductor device of claim 10, wherein:

a first one of the dielectric components is disposed near a first border of the gate; and the second one of the dielectric components is disposed near a second border of the gate opposite the first border.

12. The semiconductor device of claim 10, wherein the dielectric components are disposed over an interface formed between a dielectric material in the substrate and a doped well in the substrate.

13. The semiconductor device of claim 12, wherein:

the dielectric material circumferentially surround the doped well in a top view; and the substrate further contains a doped guard ring that circumferentially surrounds the dielectric material in the top view.

14. The semiconductor device of claim 10, wherein:

the dielectric components each have an elongate shape in a top view; and the dielectric components are disposed closer to the source than to the drain.

15. The semiconductor device of claim 10, further comprising a shallow trench isolation (STI) component disposed directly below at least a portion of the gate and near the drain.

16. A method of fabricating semiconductor device, comprising forming a gate over a substrate;

forming a plurality of dielectric components embedded in the gate and extending from a top surface of the gate to a top surface of the substrate; and forming a source region and a drain region in the substrate, wherein a portion of the substrate located between the source region and the drain region includes a channel region, and wherein the forming of the source region and the drain region is performed such that the channel region is located directly below the plurality of the dielectric components.

17. The method of claim 16, wherein:

a first one of the dielectric components is formed near a first border of the gate; and the second one of the dielectric components is formed near a second border of the gate opposite the first border.

18. The method of claim 16, further comprising: forming a doped well in the substrate and forming a dielectric material in the substrate, wherein the dielectric components are formed over an interface that is defined by the dielectric material and the doped well.

19. The method of claim 18, further comprising forming a doped guard ring in the substrate, wherein:

the dielectric material is formed to circumferentially surround the doped well in a top view; and the doped guard ring is formed to circumferentially surround the dielectric material in the top view.

20. The method of claim 16, wherein:

the dielectric components each formed to have an elongate shape in a top view; and the dielectric components are each formed to be closer to the source than to the drain.

* * * * *